(12) United States Patent
Hsu et al.

(10) Patent No.: US 8,434,043 B1
(45) Date of Patent: Apr. 30, 2013

(54) METHODOLOGY FOR ANALYSIS AND FIXING GUIDANCE OF PRE-COLORING LAYOUT

(75) Inventors: Chin-Chang Hsu, Banqiao (TW); HungLung Lin, Hsinchu (TW); Wen-Ju Yang, Hsinchu (TW); Hsiao-Shu Chao, Baoshan Township (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/480,847

(22) Filed: May 25, 2012

(51) Int. Cl.
*G06F 17/50* (2006.01)

(52) U.S. Cl.
USPC .......................................... 716/113; 716/112

(58) Field of Classification Search ............ 716/110–116
See application file for complete search history.

(56) References Cited

U.S. PATENT DOCUMENTS

| 8,108,803 B2 * | 1/2012 | Heng et al. ............... 716/50 |
| 8,185,859 B2 * | 5/2012 | Bonges, III .............. 716/126 |
| 8,219,964 B2 * | 7/2012 | Bruce et al. ............. 716/136 |

* cited by examiner

*Primary Examiner* — Binh Tat
(74) *Attorney, Agent, or Firm* — Eschweiler & Associates, LLC

(57) ABSTRACT

The present disclosure relates to a method and apparatus for identifying pre-coloring violations and for providing hints and/or warnings to a designer to eliminate the pre-coloring violations. In some embodiments, the method is performed by identifying G0-spaces within a double patterning technology (DPT) layer, of an integrated chip (IC) layout, having a plurality of pre-colored shapes. Violation paths extending between the pre-colored shapes are identified based upon the G0-spaces. Good paths (i.e., paths that will not cause a violation) and bad paths (i.e., paths that will cause a violation) between the pre-colored shapes are also identified. Hints and/or warnings are generated based upon the identified good and bad paths, wherein the hints and/or warnings provide guidance to eliminate the violation paths and develop a violation free IC layout.

20 Claims, 9 Drawing Sheets

(Pure B)

(BGB)

(Pure BBB)

(BGB)

(Complex)

METHODOLOGY FOR ANALYSIS AND
FIXING GUIDANCE OF PRE-COLORING
LAYOUT

BACKGROUND

Integrated chips are made by a process that comprises a design step and a subsequent fabrication step. During the design step, a layout of an integrated chip is generated as an electronic file. The layout comprises geometric shapes corresponding to structures to be fabricated on-chip. During the fabrication step, the layout is formed onto a semiconductor workpiece.

The resolution that a conventional lithography tool can achieve is limited to about a 45 nanometer (nm) half pitch. To continue to use existing lithography tools to resolve smaller spaces, double exposure methods have been developed. Double exposure involves breaking up the geometric shapes of a layout in a manner that forms patterns on a single layer of a substrate using multiple different masks in succession. By breaking a layout into multiple different masks, a minimum line spacing in the combined pattern is reduced while maintaining good resolution. A number of different multiple exposure techniques have been developed. In double dipole lithography (DDL), the patterns to be formed on a layer are decomposed and formed on a first mask having only horizontal lines, and on a second mask having only vertical lines. Double patterning technology (DPT) allows a vertex (angle) to be formed of a vertical segment and a horizontal segment on a same mask.

DETAILED DESCRIPTION

Figure 1A:
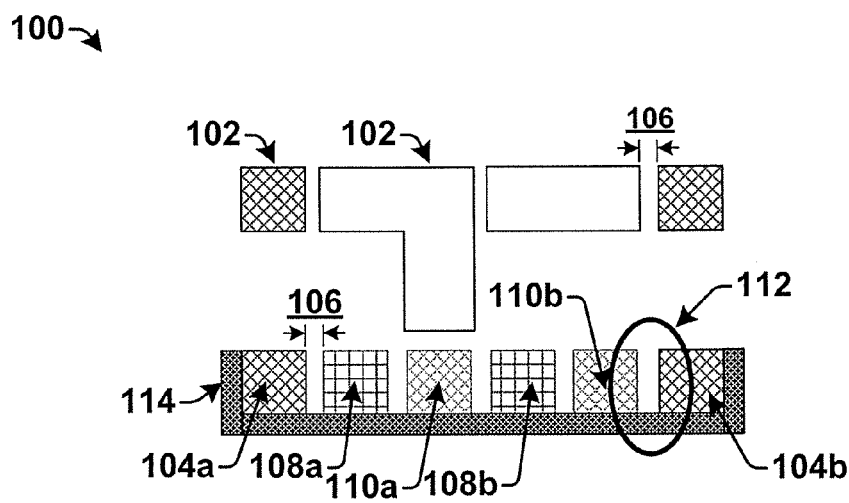
FIG. 1A illustrates an integrated chip (IC) layout showing a violation path between two pre-colored shapes.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates an integrated chip (IC) layout 100 comprising a plurality of shapes 102. The shapes 102 are separated from one another by a minimum space 106 that is not resolvable on a single photomask. In some situations, designers (i.e., users) may find it desirable to pre-assign or pre-color one or more shapes within an IC layout, so that the pre-colored shapes are formed by a same photomask. For example, in IC layout 100, shapes 104a and 104b have been pre-colored to a first color (color1) that corresponds to a first photomask. After pre-coloring, a decomposition algorithm will assign colors to shapes (e.g., 108a, 110a, 108b, 110b) between pre-colored shapes 104a and 104b in an alternating manner so that adjacent shapes are assigned different colors. By assigning adjacent shapes different colors, the adjacent shapes are formed by different photomasks. Forming adjacent shapes on different photomasks prevents shapes that are separated by the minimum space 106 from being placed on a same mask.

To ensure that the decomposition algorithm does not generate coloring conflicts, a design rule checking (DRC) deck is typically run on an IC layout prior to running the decomposition algorithm. The DRC deck will highlight violation paths that identify coloring conflicts resulting from the pre-coloring (pre-coloring violations). For example, the path extending between pre-colored shapes 104a and 104b does not allow for alternating colors (e.g., the path would have a color pattern of: color1 at 104a, color2 at 108a, color1 at 110a, color2 at 108b, color1 at 110b, and color1 at 104b). Since adjacent shapes 110b and 104b would both have the same color (color1), a violation path 114 is highlighted by the DRC deck.

Figure 1B:
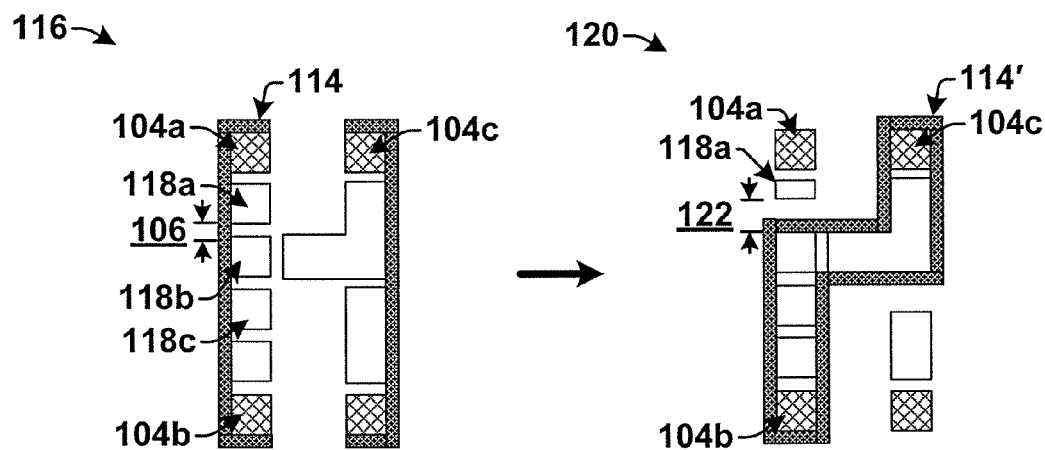
FIG. 1B illustrates a block diagram of an integrated chip (IC) layout showing design changes to design space to fix design rule violations.

In response to a violation path 114 being highlighted, a designer may either increase the G0-spacing between shapes along the violation path 114 or remove/change the coloring of one of the pre-colored shapes 104a or 104b that causes the violation path 114. However, there is no guarantee that such actions will make the IC layout free from violation paths. For example, FIG. 1B illustrates an IC layout 116 wherein a first shape 118a and a second shape 118b along a violation path 114 are separated by a minimum space 106. To correct the violation path 114, a designer may increase the spacing between the first and second shapes, 118a and 118b. However, as shown in IC layout 120, while such an increase in spacing 122 eliminates the initial violation path 114, it causes another violation path 114' to arise between pre-colored shapes 104b and 104c since uncolored shapes between pre-colored shapes 104b and 104c cannot be assigned alternating colors. Therefore, the increase in spacing 122 does not result in an IC layout free of violation paths.

Accordingly, some aspects of the present disclosure provide for a method and apparatus for identifying pre-coloring violations and for providing hints and/or warnings to a designer to eliminate the pre-coloring violations. In some embodiments, the method comprises identifying pre-coloring violations within an integrated chip (IC) layout by finding paths extending between pre-colored shapes that comprise adjacent shapes separated by a G0-space, which cannot be assigned different colors. Good paths (i.e., paths that will not cause a violation) and bad paths (i.e., paths that will cause a violation) between the pre-colored shapes are also identified. Hints and/or warnings are generated based upon the identified good and bad paths, wherein the hints and/or warnings provide guidance to eliminate the violation paths and develop a violation free IC layout.

Figure 2:
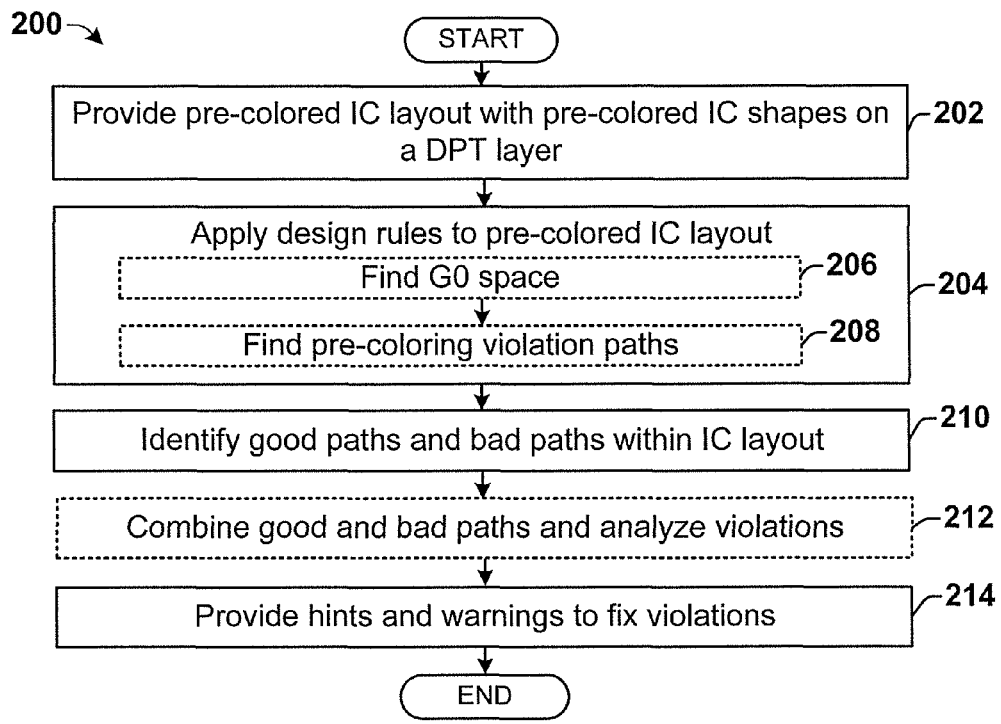
FIG. 2 is a flow diagram of some embodiments of a method of providing hints and warnings to resolve pre-coloring violations.

FIG. 2 is a flow diagram of some embodiments of a method 200 for providing hints and/or warnings to resolve pre-coloring violations. While the methods provided herein (e.g., methods 200, 500, 700, and 1000) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202, a pre-colored IC layout is provided. The pre-colored IC layout comprise one or more pre-colored shapes that are on a layer that uses double patterning technology (a DPT-layer), and that have been assigned a color corresponding to a photomask. For example, in some embodiments, a pre-colored IC layout comprises two or more shapes that have been pre-colored to have a first color and that will therefore be written to a same photomask during fabrication. In other embodiments, a pre-colored IC layout comprises multiple shapes that have been respectively pre-colored to multiple different colors (e.g., for a multi-patterning systems employing more than two photomasks per DPT-layer).

At step 204, one or more design rules are applied to the pre-colored IC layout to highlight violation paths caused by pre-colored shapes. The one or more design rules highlight violation path by identifying paths extending between two pre-colored shapes that comprise shapes separated by spaces that cannot be resolved on a single photomask (e.g., G0-spaces). If the design rules determine that the shapes cannot be assigned colors in a manner that prevents adjacent shapes from having a same color, the design rules determine that a violation path is present. Design rules may be applied to the pre-colored IC layout by running a DRC deck having one or more design rules on the pre-colored IC layout.

For example, in some embodiments, the DRC deck is configured to identify minimum separator distances ("G0-spaces") along paths between pre-colored shapes within a pre-colored IC layout at step 206, wherein shapes separated by a G0-space cannot be resolved on a single photomask. Different DPT-layers may have different values of G0-space. Additionally, different configurations of shapes on a same DPT-layer may have different G0-spaces. For example, the G0-space for end-to-end configurations is generally larger than the G0-space for end-to-side or side-to-side configurations, due to line end shortening.

At step 208, based upon the identified G0-spaces, the DRC deck is configured to highlight "violation paths" that will generate coloring conflicts upon being decomposed. For example, based upon identified G0-spaces along each path between two pre-colored shapes, the DRC deck will determine if assigning different mask colors to such shapes will result in a coloring conflict along a path, taking into consideration that shapes separated by a G0-space cannot be resolved on a same mask. If a path contains a color conflict, the path is a violation path.

At step 210, good paths and bad paths within the pre-colored layout are identified. "Good paths" are paths that will not cause a coloring conflict when decomposition is performed. "Bad paths" are paths that will cause a coloring conflict when decomposition is performed. The good paths and bad paths are identified between two pre-colored shapes. The two pre-colored shapes will have a first path that extends along a first side of the pre-colored shapes and a second path that extends along a second side of the pre-colored shapes. In some embodiments, adjacent shapes in a pre-colored IC layout may be associated with a first good/bad path (extending between first and second pre-colored shapes) on a first side of the shapes and a second good/bad path (extending between first and third pre-colored shapes) on a second side of the shapes.

At step 212, a combination of the good paths and the bad paths may be generated and analyzed. The combination may be analyzed to determine whether an associated violation path is fixable. In some embodiments, a combination of paths abutting a space are analyzed to determine if changing a size of the space will eliminate the violation path(s) associated with the space. In other embodiments, a combination of adjacent paths are analyzed to determine if adjusting the color of a pre-colored shape within the adjacent paths will eliminate the violation path(s) associated with the pre-colored shape.

At step 214, hints and/or warnings to eliminate the violation path(s) are provided to a designer based upon analysis of the good and bad paths. A hint indicates a change that can be made to the pre-colored IC layout to bring the layout into compliance with the design rules (i.e., to eliminate violation paths). For example, a hint may indicate to a designer that pre-coloring should be removed from a pre-colored shape or that a minimum G0-spacing between adjacent shapes should be increased. If a designer makes a change in regards to a hint (e.g., remove pre-coloring from a pre-colored shape or increase a minimum G0-spacing), it will eliminate a violation path associated with the hint by removing the coloring conflict identified in the violation path. A warning indicates that a change, which if made, will not directly bring the IC layout into compliance with the design rules (i.e., that will not eliminate violation paths). For example, if a designer makes a change in response to a warning, it may eliminate the immediate violation path, but result in another violation path.

Figure 3:
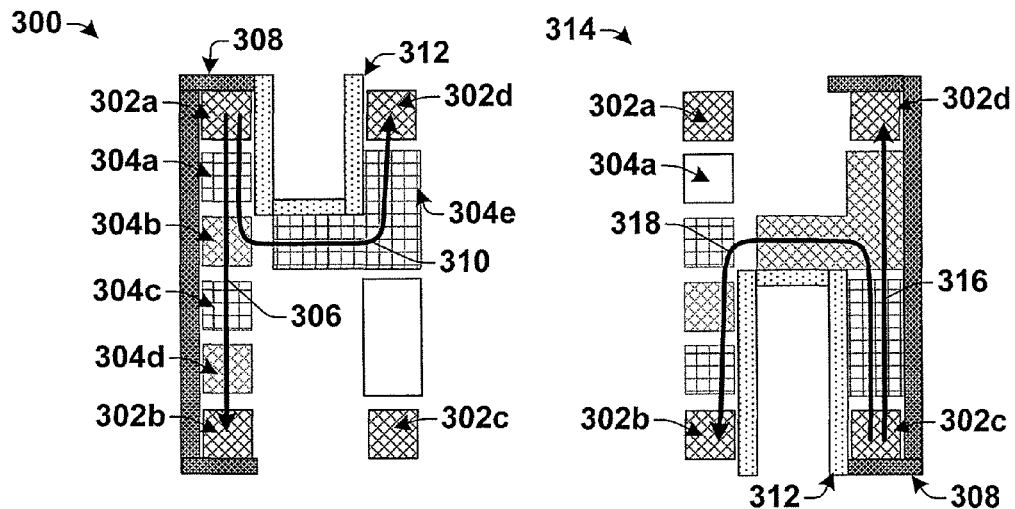
FIG. 3 illustrates exemplary IC layouts showing examples of good paths and bad paths.

FIG. 3 illustrates exemplary IC layouts 300, 314 showing examples of good paths and bad paths. Although IC layouts 300,314 are illustrated as comprising a plurality of polygons comprising square or rectangles, it will be appreciated that such shapes are not limiting. Rather, the disclosed method and apparatus may be applied to designs having shapes of any geometry allowed by design rules. Furthermore, the disclosed shapes may comprise any DPT-layers, such as for example, metal interconnect layers, polysilicon layers, active layers, etc.

IC layout 300 comprises a plurality of pre-colored shapes 302a, 302b, 302c, and 302d that have been assigned a first color. To determine violation paths, the DRC deck will begin with a first pre-colored shape. Adjacent shapes that are separated from the first pre-colored shape by a spacing equal to or less than the G0-space are identified. Then the adjacent shapes that are separated from the adjacent shape by a spacing equal to or less than the G0-space are identified. This process is continued until one or more paths extending from the first pre-colored shape to the second pre-colored shape are identified.

For example, in IC layout 300 the shapes 302a, 304a, 304b, 304c, 304d, and 302b are separated by a G0-space along a first path 306 and shapes 302a, 304a, 304b, 304e, and 302d are separated by a G0-space along a second path 310, such that during decomposition adjacent shapes within the first and second paths, 306 and 310, will be assigned separate colors that place the shapes on separate masks. Alternating between a first color (color1; meaning that it will be assigned to a first mask) and a second color (color2; meaning that it will be assigned to a second mask) along the first path 306 causes the path 306 to have a color pattern of: color1, color2, color1, color2, color1, color1. Since the first color (color1) is assigned to two adjacent shapes 304d and 302b, the first path 306 will result in a violation path and is therefore a "bad path". In some embodiments, a bad path may be assigned a first marker 308 indicating a bad path. Alternating between the first and second colors along a second path 310 causes the path 310 to have a color pattern of: color1, color2, color 1, color2, color1. Since no adjacent shapes have the same color, the second path 310 will not result in a violation and therefore is a "good path". In some embodiments, a good path may be assigned a second marker 312 indicating a good path.

As shown in IC layout 314, both good and bad paths also exist between pre-colored shapes 302c and 302b and between pre-colored shapes 302c and 302d. For example, IC layout 314 comprises a first path 316 that is a good path and a second path 318 that is a bad path. The first good path 316 has no two adjacent shapes that have a same color (e.g., the first good path has a color pattern of: color1, color2, color 1, color2, color1, color2, color1). The bad second path 318 has two adjacent shapes that have a same color (e.g., the second bad path has a color pattern of color1, color2, color 1, color1).

Figure 4:
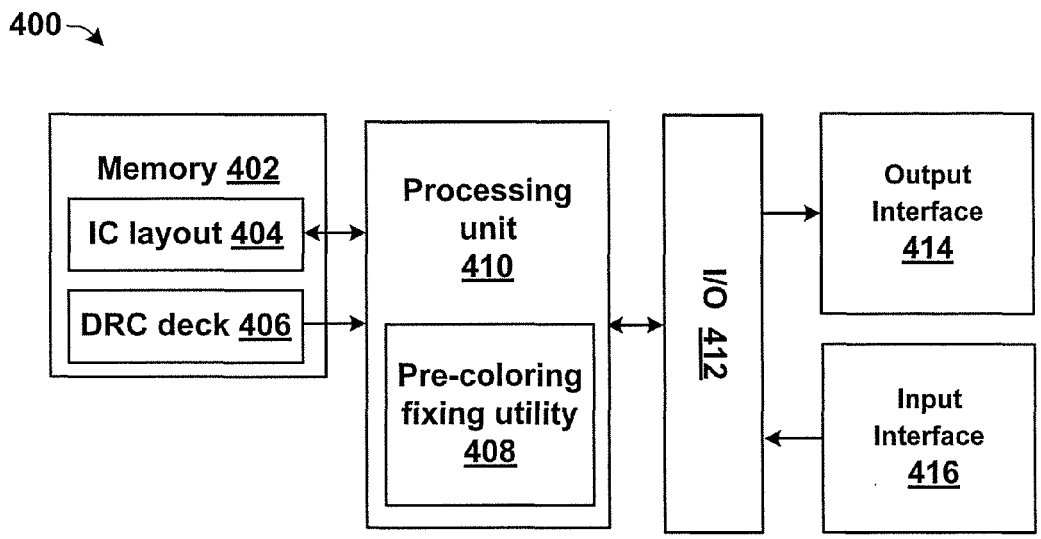
FIG. 4 illustrates some embodiments of a computer system configured to generate hints and/or warnings to a designer to eliminate the pre-coloring violations within an IC layout.

FIG. 4 illustrates some embodiments of a computer system 400 configured to generate hints and/or warnings to a designer (i.e., user) to eliminate the pre-coloring violations within an IC layout. The computer system 400 includes a memory element 402 and a processing unit 410. Memory element 402 is configured to store an IC layout 404 and a DRC deck 406. The IC layout 404 comprises a graphical representation of an integrated chip, such as for example a GDSII file. The DRC deck 406 comprises a list of design rules specific to a semiconductor process chosen for fabrication of the IC layout 404. In some embodiments, the memory element 402 comprises a machine readable storage medium, configured to store computer readable instructions for execution by processing unit 410, for example.

The processing unit 410 is configured to receive the IC layout 404 and the DRC deck 406 as inputs. From the IC layout 404 and the DRC deck 406, the processing unit 410 is configured to identify violation paths within the IC layout 404. The violation paths are provided to a pre-coloring utility 408, which is configured to identify good paths and bad paths within the IC layout 404 caused by the pre-colored shapes. The pre-coloring utility 408 is further configured to analyze the good paths and bad paths within the IC layout 404 and to generate hints and/or warnings regarding how to eliminate the violation paths. In some embodiments, the processing unit and pre-coloring utility 408 comprise a single processor. In other embodiments, the processing unit 410 comprises a first processor, while the pre-coloring utility 408 comprises a separate, second processor.

The hints and/or warnings are provided by way of an I/O 412 to an output interface 414 that allows the processing unit 408 to exchange information with the external environment. The output interface 414 may comprise a visual output (e.g., an LCD or LED screen), for example. In some embodiments, the computer system 400 further comprises one or more input interfaces 416 that allows for a designer to respond to the hints and/or warnings in a manner that eliminates the violation paths from the IC layout 404. In some embodiments, the input interfaces 416 comprises a tactile input (e.g., push buttons and/or a keyboard), for example.

Figure 5:
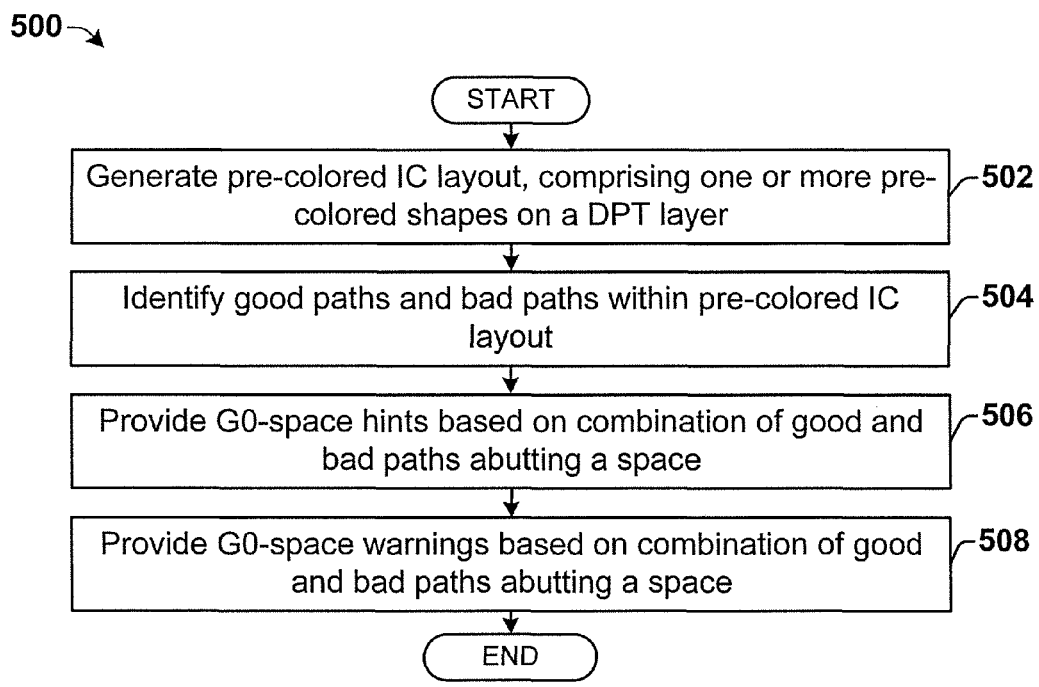
FIG. 5 is a flow diagram of some embodiments of a method of providing G0-space hints and warnings to resolve pre-coloring violations.

FIG. 5 is a flow diagram of some embodiments of a method 500 for providing hints and/or warnings to resolve pre-coloring violations by removing G0-spaces from an IC layout.

At step 502, an IC layout comprising one or more pre-colored shapes (i.e., shapes assigned a color prior to decomposition) on a DPT layer is generated.

At step 504, good paths and bad paths within the pre-colored IC layout are identified.

At step 506, G0-space hints are selectively provided to spaces between two adjacent shapes. A G0-space hint is provided to a space based upon a combination of paths abutting the space. For example, a G0-space hint is provided for a space if the space is disposed between a bad path and a bad path. In some embodiments, the G0-space hints comprise highlighted spaces within the pre-colored IC layout. In such embodiments, enlarging a highlighted space above the G0-space will reduce a number of violation paths within a pre-colored IC layout.

At step 508, G0-space warnings are provided to spaces between two adjacent shapes. A G0-space warning is provided to a space based upon a combination of paths abutting the space. For example, a G0-space warning is provided to a space if the space is disposed between a good path and a bad path. In some embodiments, the G0-space warnings comprise highlighted spaces within the pre-colored IC layout, which upon being enlarged above the G0-space will not reduce a number of violation paths within the DPT layer.

Figure 6A:
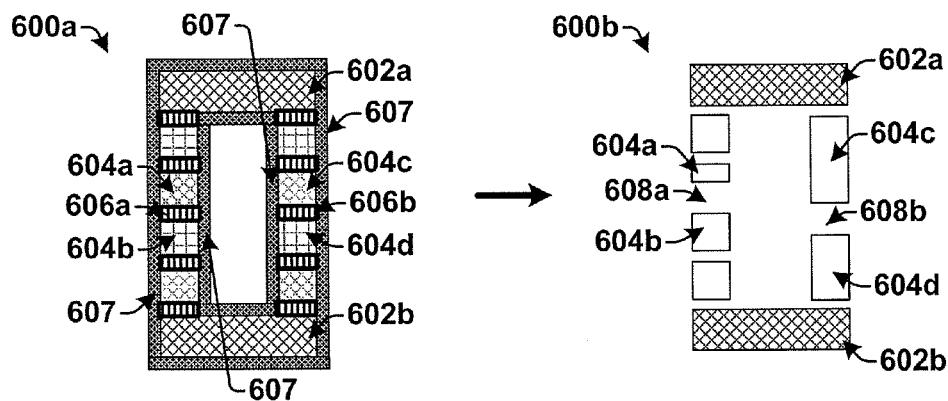
FIGS. 6A-6C illustrate IC layouts showing some embodiments of the use of G0-space hints to remove violation paths.
Figure 6B:
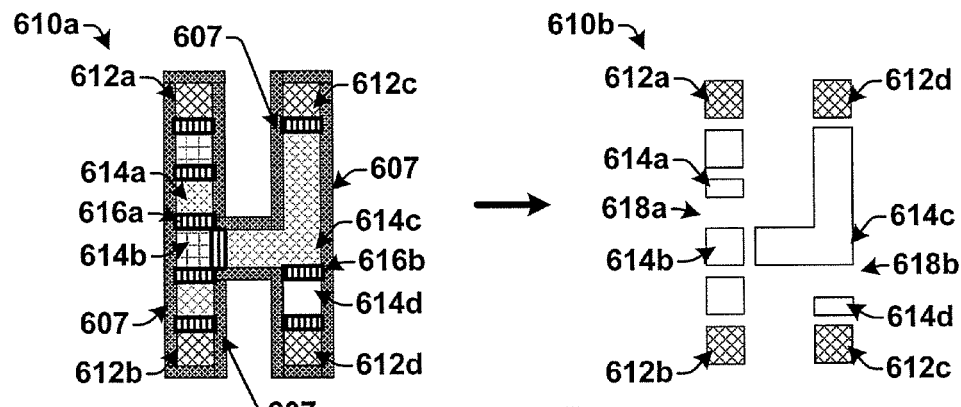
Figure 6C:
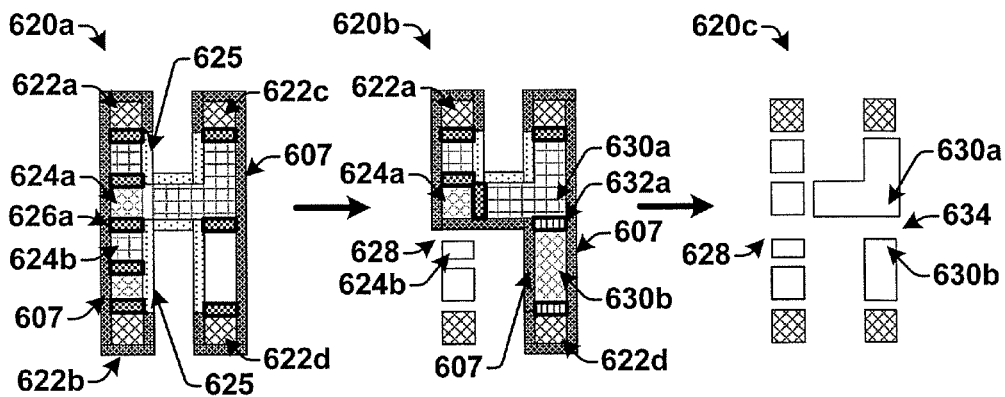

FIGS. 6A-6C illustrate some embodiments of exemplary IC layouts upon which method 500 of providing G0-space hints and/or warnings to resolve pre-coloring violations is applied. It will be appreciated that in the layouts illustrated herein, only the shapes indicated as "pre-colored" shapes are assigned colors prior to decomposition. However, to help the reader appreciated the good and bad paths, layouts provided herein (FIGS. 6A-6C, 10A-10E) illustrate un-colored shapes between pre-colored shapes as having a faded color. For example, in FIG. 6A, shapes (e.g., 604a, 604b, etc.) on the path between pre-colored shapes 602a and 602b are not pre-assigned a color (i.e., do not have color in a design environment), but are illustrated as having a faded color to show that a bad path is present between the pre-colored shapes 602a and 602b.

In a first IC layout 600a shown in FIG. 6A, an "O" structure comprises a first pre-colored shape 602a and a second pre-colored shape 602b. A first vertical line and a second vertical line extend from a first pre-colored shape 602a to the second pre-colored shape 602b. The first vertical line comprises a first shape 604a and a second shape 604b. The first and second shapes 604a, 604b are separated by a space having a hint marker 606a, since the space has bad paths 607 on both sides. The second vertical line comprises a third shape 604c and a fourth shape 604d. The third and fourth shapes 604c, 604d are separated by a space having a hint marker 606b, since the space has bad paths 607 on both sides.

In a second IC layout 600b shown in FIG. 6A, the "O" structure has been modified in response to the hint marker 606a to increase the spacing 608a between the first shape 604a and the second shape 604b. Similarly, the structure has been modified in response to the hint marker 606b to increase the spacing 608b between the third shape 604c and the fourth shape 604d. The resulting second IC layout 600b does not have violation paths between the first pre-colored shape 602a and the second pre-colored shape 602b (i.e., no adjacent structure within either vertical line of the structure will be assigned the same coloring during decomposition).

In a first IC layout 610a shown in FIG. 6B, an "H" structure comprises four pre-colored shapes 612a-612d. A first vertical line of the structure extends from pre-colored shape 612a to the pre-colored shape 612b, and comprises a first shape 614a and a second shape 614b. The first and second shapes 614a, 614b are separated by a space having a hint marker 616a, since the space has bad paths 607 on both sides. A second vertical line of the structure extends from pre-colored shape 612c to pre-colored shape 612d, and comprises a third shape 614c and a fourth shape 614d. The third and fourth shapes 614c, 614d are separated by a space having a hint marker 616b, since the space has bad paths 607 on both sides.

In a second IC layout 610b shown in FIG. 6B, the "H" structure has been modified in response to the hint marker 616a to increase the spacing between the first shape 614a and a second shape 614b. Similarly, the structure has been modified in response to the hint marker 616b to increase the spacing between the third shape 614c and the fourth shape 614d. The resulting IC layout 610b does not have violations paths between the pre-colored shapes 612a-612d.

In a first IC layout 620a shown in FIG. 6C, an "H" structure comprises four pre-colored shapes 622a-622d. A first vertical line of the structure extends from pre-colored shape 622a to pre-colored shape 622b, and comprises a first shape 624a and a second shape 624b. The first and second shapes 624a, 624b are separated by a space having a warning marker 626a, since the space has a good path 625 on one side and a bad path 607 on the other side.

If the size of the space between shapes 624a and 624b is increased in response to the warning marker 626a, a new violation path is generated, as shown in the second IC layout 620b of FIG. 6C. The new violation path extends from pre-colored shape 622a to pre-colored shape 622d. The new violation path comprises a third shape 630a and a fourth shape 630b. The third and fourth shapes 630a, 630b are separated by a space having a hint marker 632a, since the space has bad paths 607 on both sides.

In a third IC layout 620c shown in FIG. 6C, the "H" structure has been modified in response to the hint marker 632a to increase the spacing between shape 630a and a shape 630b. The resulting IC layout 620c does not have violations paths between the pre-colored shapes 622a-622d.

Figure 7:
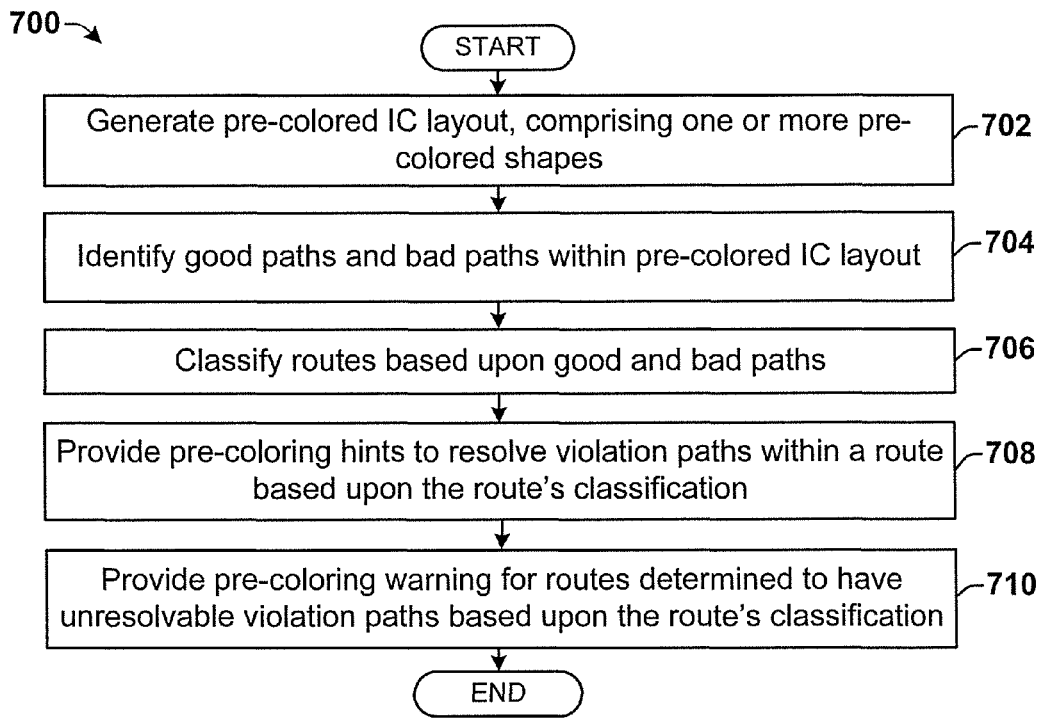
FIG. 7 is a flow diagram of some embodiments of a method of providing pre-coloring hints and warnings to resolve pre-coloring violations.

FIG. 7 a flow diagram of some embodiments of a method 700 for providing hints and/or warnings to resolve pre-coloring violations by changing the color of or removing color from pre-colored shapes within a pre-colored IC layout.

At step 702, a pre-colored IC layout is generated. The pre-colored IC layout comprises one or more shapes on a DPT layer that are pre-colored (i.e., assigned a color prior to decomposition).

At step 704, good paths and bad paths within the pre-colored IC layout are identified. In some embodiments, the good paths and the bad paths are identified based upon G0-spaces within the pre-colored IC layout.

At step 706, a route within an IC layout is classified based upon identified good and bad paths along the route. A route comprises one or more contiguous paths along a structure. Routes are classified based upon the one or more paths. For example, a route comprising a plurality of adjacent bad paths may be classified as a "pure B" route, while a route comprising a good path between two bad paths is classified as a "BGB" route. It will be appreciated that the route classifications illustrated herein (e.g., in FIGS. 8A-8C and 10A-10E) are non-limiting examples of routes for illustrating the method.

At step 708, pre-coloring hints are provided to resolve pre-coloring violation paths along a route, based upon the route's classification. In some embodiments, the pre-coloring hints can be provided to one or more pre-colored shapes within a route. The pre-coloring hints resolve pre-coloring violations by adjusting the color of (e.g., to remove color from or change the color of) one or more pre-colored shapes. The pre-colored shape to be adjusted within a route depends upon the classification of the route. Some examples of route classifications are shown below in FIGS. 8A-8C.

At step 710, pre-coloring warnings are provided for a route determined to have unresolveable violation paths based upon the route's classification. In some embodiments, a pre-coloring warning is provided to pre-colored shapes that cannot be adjusted based upon pre-coloring hints to reduce a number of violation paths with the DPT layer. For example, a pre-coloring warning may be provided to pre-colored shapes between a good path abutting a bad on one side but not the other.

Figure 8A:
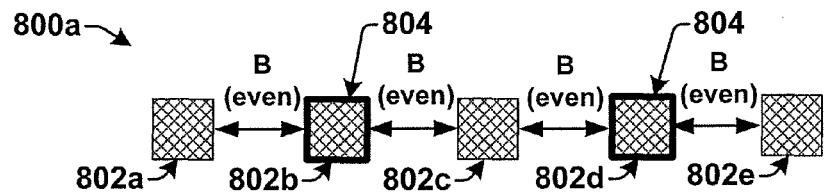
FIGS. 8A-8C illustrate some embodiments of pre-coloring hints for solving simple combinations of paths along a route.
Figure 8A:
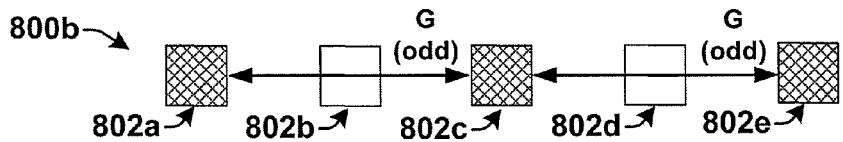
Figure 8B:
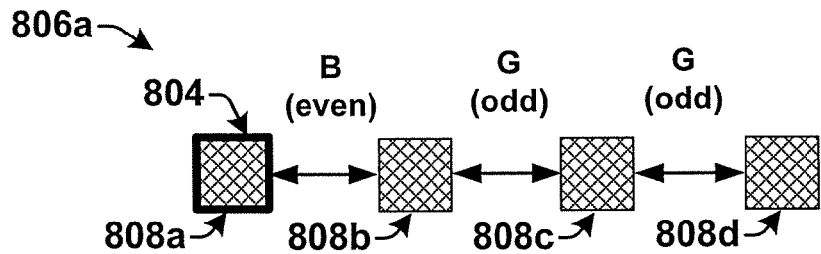
Figure 8B:
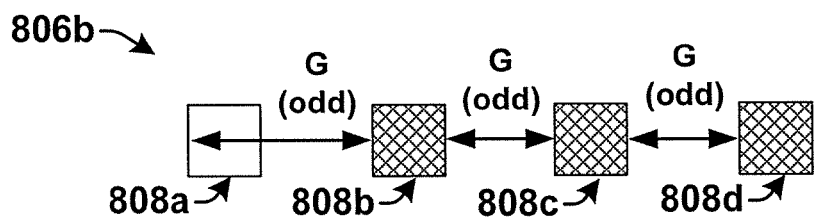
Figure 8C:
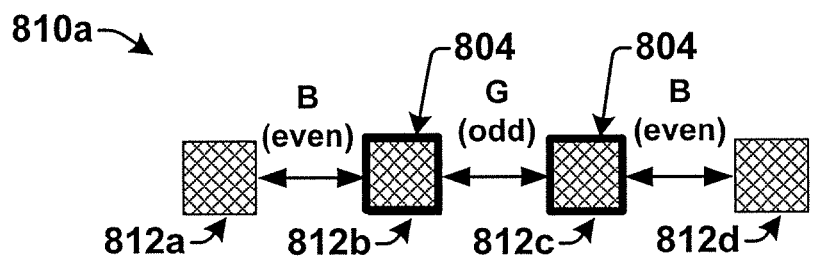
Figure 8C:
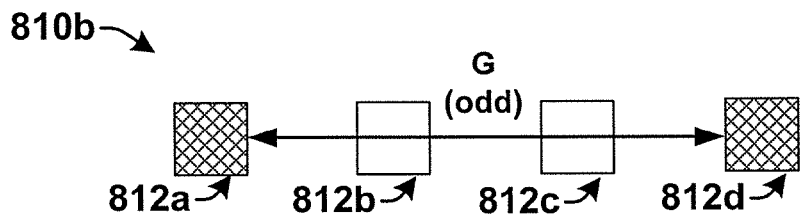

FIGS. 8A-8C illustrate some embodiments of pre-coloring hints for solving simple combinations of paths along a route.

FIG. 8A illustrates pre-coloring hints for solving route classified as "Pure B" cases, which comprise one or more adjacent bad paths (e.g., a B, BB, BBB, etc.). For such cases, a pre-coloring hint is generated to adjust the color of (e.g., to remove color from or change the color of) one or more interval pre-colored shapes. For example, as shown in FIG. 8A, in route 800a bad paths (B) exist between pre-colored shapes 802a-802e. This is because if an even number of uncolored shapes are disposed between pre-colored shapes, a bad path (B) extends between the pre-colored shapes. For example, between shapes 802a and 802b any even number of uncolored shapes (e.g., 0, 2, 4, etc.) will result in a bad path (B) since the even number of uncolored shapes will result in two adjacent shapes having a same color (i.e., a coloring violation) during decomposition (e.g., if there are two intermediate uncolored shapes between 802a and 802b, one of the two intermediate uncolored shapes will be assigned a same color as 802a or 802b, upon decomposition).

Therefore, to eliminate the bad paths, a pre-coloring hint 804 is provided to adjust the color of interval pre-colored shapes 802b and 802d. The resulting route 800b, having color removed and/or changed for pre-colored shapes 802b and 802d, is violation free. This is because removing pre-coloring from shape 802b and 802d, results in a path between pre-colored shapes 802a and 802c that has an odd number of shapes (e.g., the odd number of shapes equals the sum of the even number of shapes between 802a and 802b, shape 802b, and the even number of shapes between 802b and 802c), which allow for no two adjacent shapes to have a same color (i.e., a good path).

FIG. 8B illustrates pre-coloring hints for solving routes classified as "BG" or BG . . . GB" cases, which comprise a bad path located at an end of a line and adjacent to a good path. For such cases, a pre-coloring hint is generated to adjust the color of (e.g., to remove color from or change the color of) pre-colored shapes at the outside of a route. For example, as shown in FIG. 8B, in route 806a a bad path exists between pre-colored shapes 808a and 808b, while good paths exist between pre-colored shapes 808b and 808c and between 808c and 808d. This is because if an even number of uncolored shapes (e.g., 0, 2, 4, etc.) are disposed between pre-colored shapes a bad path (B) extends between the pre-colored shapes, since upon being decomposed the even number of uncolored shapes will result in two adjacent shapes having a same color. If an odd number of uncolored shapes (e.g., 1, 3, 5, etc.) are disposed between pre-colored shapes a good path (G) extends between the pre-colored shapes, since upon being decomposed the odd number of uncolored shapes will not result in two adjacent shapes having a same color.

Therefore, to eliminate the bad paths, a pre-coloring hint 804 is provided to adjust the color of outer pre-colored shape 808a. The resulting route 806b is violation free. This is because by removing pre-coloring from shape 808a, the path between shapes 808a and pre-colored shape 808b will have an odd number of shapes (e.g., the odd number of shapes equals the sum of the even number of shapes between 808a and 808b and shape 808a), which allow for no two adjacent shapes to have a same color (i.e., a good path).

FIG. 8C illustrates pre-coloring hints for solving routes classified as "BGB" cases, which comprise a good path that is between bad paths. For such cases, a pre-coloring hint is generated to adjust the color of two pre-colored shapes in the center of the route. For example, as shown in FIG. 8C, in route 810a bad paths exist between pre-colored shapes 812a and 812b and between 812c and 812d, while a good path exists between 812b and 812c. As stated above, this is because if an even number of uncolored shapes (e.g., 0, 2, 4, etc.) are disposed between pre-colored shapes a bad path (B) extends between the pre-colored shapes, while if an odd number of uncolored shapes (e.g., 1, 3, 5, etc.) are disposed between pre-colored shapes a good path (G) extends between the pre-colored shapes.

Therefore, to eliminate the bad paths, pre-coloring hints 804 are provided to adjust the color of center pre-colored shapes 812b and 812c. The resulting route 810b is violation free. This is because by removing pre-coloring from shapes 812b and 812c, the path between pre-colored shapes 812a and 812d will have an odd number of shapes (e.g., the odd number of shapes equals the sum of the even number of shapes between 812a and 812b, shape 812b, the odd number of shapes between 812b and 812c, shape 812c, and the even number of shapes between 812c and 812d), which allow for no two adjacent shapes to have a same color (i.e., a good path).

Figure 9:
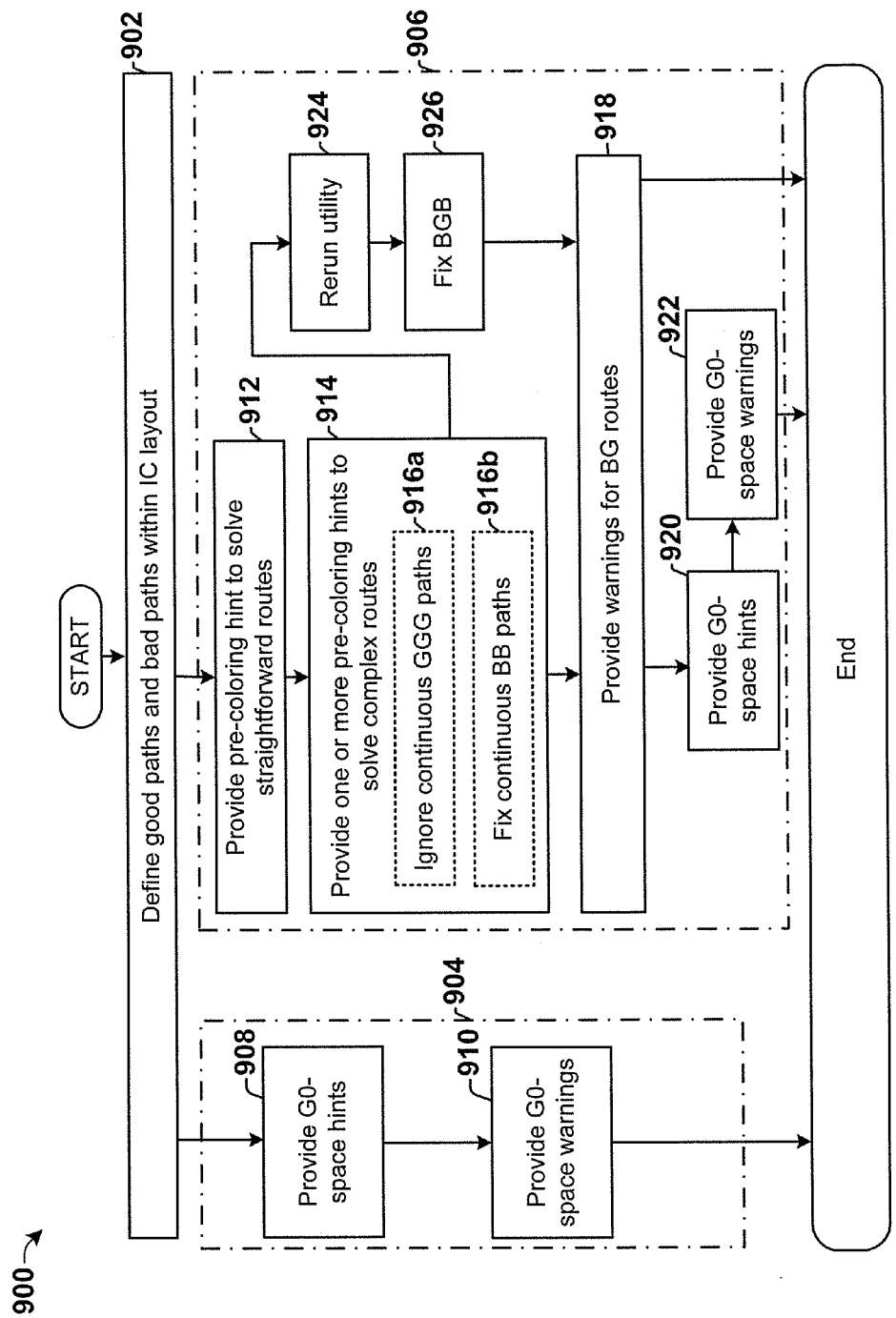
FIG. 9 is a flow diagram of some embodiments of a detailed method of providing hints and warnings to resolve pre-coloring violations.

FIG. 9 a flow diagram of some embodiments of a method 900 for providing hints and/or warnings to resolve pre-coloring violations by changing G0-space and/or changing or removing pre-colored shapes from an IC layout.

At step 902, good paths and bad paths within the pre-colored IC layout are identified.

At step 904, violation paths are addressed by G0-space hints and/or warnings that indicate how a layout can be fixed by adjusting spacing within the layout. In some embodiments G0-space hints (step 908) and G0-space warnings (step 910) are provided At step 906, violation paths are addressed by pre-coloring hints and/or warnings that indicate how a layout can be fixed by adjusting the color of pre-colored shapes within the layout.

In some embodiments, pre-coloring hints and warnings are provided for straightforward routes at step 912. The straightforward routes comprise routes classified as pure B routes (e.g., B, BB, BBB, etc.) BGB routes, and BG . . . GB routes (described above in FIGS. 8A-8C).

If a route cannot be resolved by pre-coloring hints and warnings at step 912 (i.e., the route cannot be resolved by the rules described above in FIGS. 8A-8C), the route is a complex route. To resolve a complex route a series of rules (e.g., a succession of hints and/or warnings) are applied to the route to simplify the complex route to a simple route that can be resolved.

Therefore, at step 914, one or more pre-coloring hints are provided for complex routes, which have a combination of bad and good paths that does not fall into a straightforward classification (e.g., that is a combination of other classifications). Since violation paths within the complex routes cannot be resolved by pre-coloring hints for the straightforward routes, the complex routes are instead solved by operating upon the complex route with a succession of hints, wherein respective hints are configured to reduce the complexity of the route.

In some embodiments, one of the pre-coloring hints comprises a hint to ignore continuous GGG paths (step 916a) within a complex route. In some embodiments, one of the pre-coloring hints comprises a hint to resolve continuous BB paths (i.e., BB cases between good paths) (step 916b) within a complex route. In some embodiments, once hints have been used to reduce the complexity of a complex route, warnings are provided for unresolved BG routes (step 918) (i.e., good paths abutting a bad on one side but not the other). In some embodiments, a suggestion to fix the BG route by providing a G0-space hint (step 922) and/or a G0-space warning (step 920). In some other embodiments, once hints have been used to reduce the complexity of a complex route the method is rerun (steps 912-916 are performed again) and BGB cases within a complex route are fixed (as shown in FIG. 8C) (step 926).

For example, a complex route may comprise a combination of good paths (G) and bad paths (B) comprising GBGBBBG-GBGGGGGBBGGBGBG (i.e., a good path, abutting a bad path, abutting a good path, etc.). To resolve the complex route, a first hint is provided to operate upon the complex route to ignore continuous GGG paths (e.g., step 916a), resulting in the complex routing being separated into 2 routes GBG-BBBGGBG, GBBGGBGBG. A second hint is then provided to operate upon the complex route with to resolves continuous BB paths (e.g., step 916b), causing the BB section of the complex route to turn into a good path (e.g., as shown in FIG. 8A) and resulting in the 2 routes being GBGBGGGBG, GGGGBGBG. Since the complex route is still complex, the utility is rerun (e.g., step 924) and a third hint is provided to operate upon the complex route to resolve BGB cases (e.g., step 926), causing the BGB section of the route to turn into a good path (e.g., as shown in FIG. 8C) and resulting in the 2 routes being GGGGGBG, GGGGGG. A warning can then be provided to resolve the BG case (e.g., step 918) (note: this BG case is not like the BGG case shown in FIG. 8B since the B is not at an end of the route).

FIGS. 10A-10E illustrate some embodiments of exemplary IC layouts having different pre-coloring classifications upon which the method 900 of providing pre-coloring hints and/or warnings to resolve pre-coloring violations is applied.

Figure 10A:
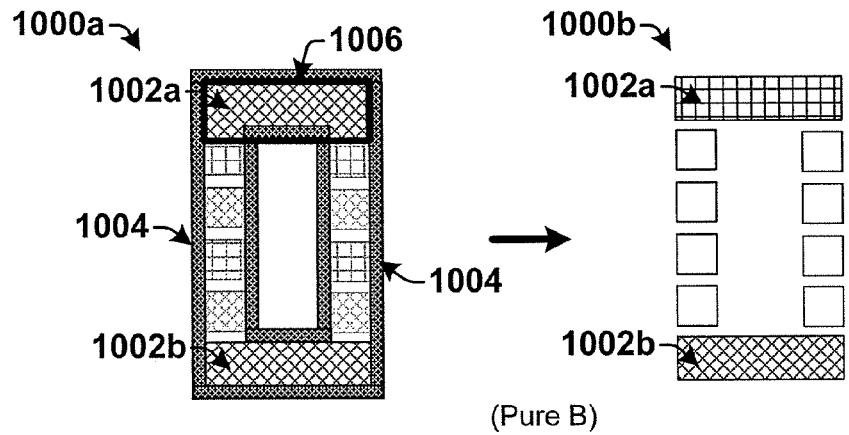
FIGS. 10A-10E illustrate some exemplary IC layouts having different pre-coloring combinations, which show the use of pre-coloring hints to remove violation paths.

In a first IC layout 1000a shown in FIG. 10A, a structure comprises a first pre-colored shape 1002a and a second pre-colored shape 1002b. A bad path 1004 extends between the first and second pre-colored shapes, 1002a and 1002b, since alternating colors cannot be assigned to shapes along a path extending between 1002a and 1002b without adjacent shapes in the path having a same color. Therefore, the first IC layout 1000a comprises a pure B case. A pre-coloring hint marker 1006 indicates that adjusting the color of (e.g., removing color from or changing the color of) pre-colored shape 1002a will resolve the violation paths.

In a second IC layout 1000b shown in FIG. 10A, the structure has been modified in response to the pre-coloring hint marker 1006 to adjust the color of the first pre-colored shape 1002a from a first color to a second color. Such an adjustment in color causes the second IC layout 1000b to be free of coloring violations. This is because adjusting the coloring of pre-colored shape 1002a allows for a decomposition algorithm to assign alternating colors to adjacent shapes within IC layout 1000b. For example, a color pattern from shape 1002b

(which is pre-colored to color1) to shape 1002*a* (which is pre-colored to color2) would be color1, color2, color1, color2, color1, color2.

Figure 10B:
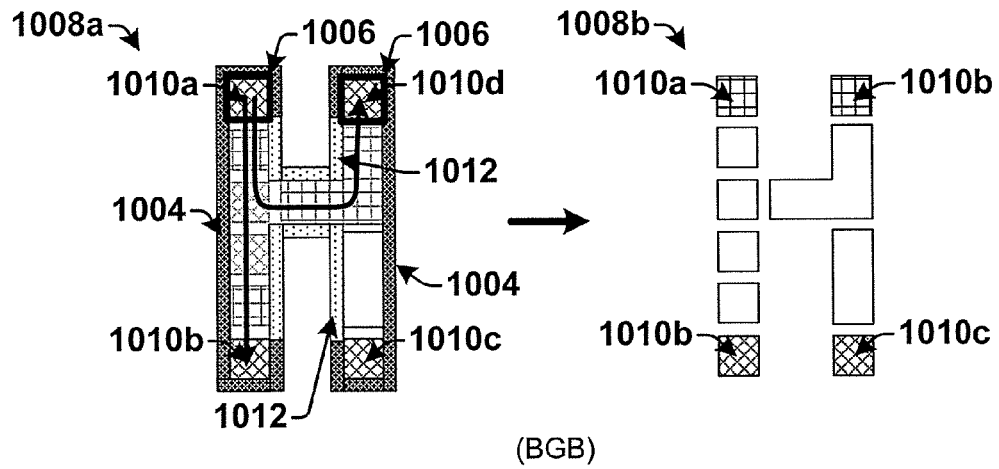

In a first IC layout 1008*a* shown in FIG. 10B, a structure comprises pre-colored shapes 1010*a*-1010*d*. A bad path 1004 extends between a first and second pre-colored shapes, 1010*a* and 1010*b* since alternating colors cannot be assigned to shapes along a path extending between 1010*a* and 1010*b* without adjacent shapes in the path having a same color. A good path 1012 extends between the second pre-colored shape 1010*b* and a third pre-colored shape 1010*d* since alternating colors can be assigned to shapes along a path extending between 1010*b* and 1010*d* without adjacent shapes in the path having a same color. A bad path 1004 extends between the third pre-colored shape 1010*c* and a fourth pre-colored shape 1010*d*. A good path 1012 extends between the fourth pre-colored shape 1010*d* and the first pre-colored shape 1010*a*. Therefore, IC layout 1008*a* comprises a BGB case.

Since layout 1008*a* comprises a BGB case, pre-coloring hint marker 1006 are provided to adjust the color of pre-colored shapes at the ends of the BGB, indicating that an adjustment of the color of the pre-colored shapes 1010*a*, 1010*d* will resolve the violation paths. In a second IC layout 1008*b* shown in FIG. 10B, the structure has been modified in response to the hint marker 1006 to change in the color of the first pre-colored shape 1010*a* and the fourth pre-colored shape 1010*d* from a first color to a second color. Such a change in color causes the second IC layout 1008*b* to be free of coloring violations. This is because adjusting the coloring of pre-colored shapes 1010*a* and 1010*b* allows for a decomposition algorithm to assign alternating colors to adjacent shapes within IC layout 1008*b*. For example, a color pattern from shape 1010*b* (which is pre-colored to color1) to shape 1010*a* (which is pre-colored to color2) would be color1, color2, color1, color2, color1, color2.

Figure 10C:
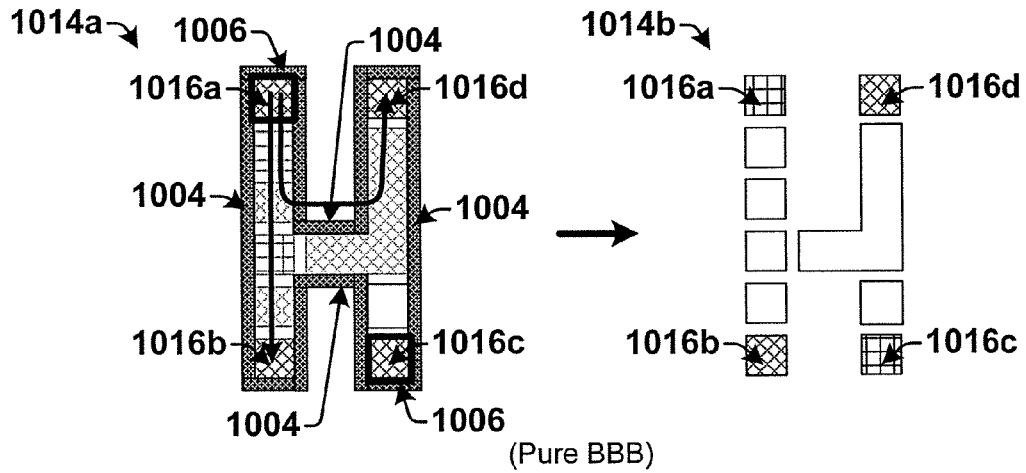

In a first IC layout 1014*a* shown in FIG. 10C, a structure comprises pre-colored shapes 1016*a*-1016*d*. A bad path 1004 extends between a first pre-colored shape 1016*a* and a second pre-colored shape 1016*b*, between the second pre-colored shape 1016*b* and a third pre-colored shape 1016*d*, between the third pre-colored shape 1016*c* and a fourth pre-colored shape 1016*d*, and between the fourth pre-colored shape 1016*d* and the first pre-colored shape 1016*a*. Therefore, IC layout 1014*a* comprises a BBB case.

Since layout 1014*a* comprises a BBB case, pre-coloring hint markers 1006 are provided to adjust the color of pre-colored shapes at the end of the BBB, indicating that an adjustment of the color of the pre-colored shapes 1016*a*, 1016*c* will resolve the violation paths. In a second IC layout 1014*b* shown in FIG. 10C, the structure has been modified in response to the pre-coloring hint markers 1006 to change in the color of the first pre-colored shape 1016*a* and the third pre-colored shape 1016*d* from a first color to a second color. Such a change in color causes the second IC layout 1014*b* to be free of coloring violations. This is because adjusting the coloring of pre-colored shapes 1016*a* and 1016*c* allows for a decomposition algorithm to assign alternating colors to adjacent shapes within IC layout 1014*b*. For example, a color pattern from shape 1016*c* (which is pre-colored to color2) to shape 1016*d* (which is pre-colored to color1) would be color2, color1, color2, color1.

Figure 10D:
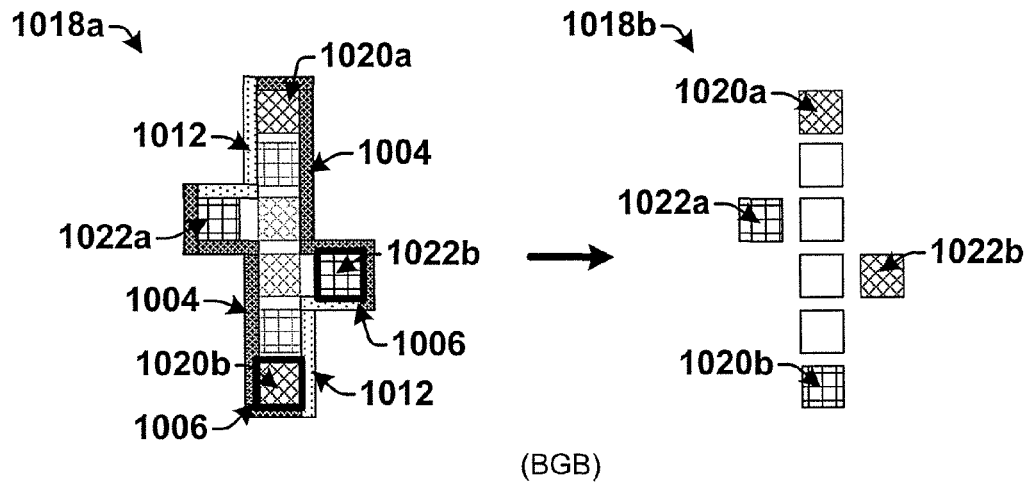

In a first IC layout 1018*a* shown in FIG. 10D, a structure comprises pre-colored shapes 1020*a*-1020*b* having a first color, and pre-colored shapes 1022*a*-1022*b* having a second color. A bad path 1004 extends between pre-colored shapes 1022*a* and 1020*b*. A good path 1012 extends between pre-colored shapes 1020*b* and 1022*b*. A bad path 1004 extends between pre-colored shapes 1022*c* and 1020*a*. A good path 1012 extends between pre-colored shapes 1020*a* and 1022*a*. Therefore, IC layout 1018*a* comprises a BGB case.

Since layout 1018*a* comprises a BGB case, pre-coloring hint markers 1006 are provided to adjust the color of pre-colored shapes at the ends of the BGB, indicating that an adjustment of the color of the pre-colored shapes 1020*b*, 1022*b* will resolve the violation paths. In a second IC layout 1018*b* shown in FIG. 10D, the structure has been modified in response to the hint markers 1006 to change in the color of the pre-colored shapes 1020*b* and 1022*b*. Such a change in color causes the second IC layout 1018*b* to be free of coloring violations. This is because adjusting the coloring of pre-colored shapes 1020*b* and 1022*b* allows for a decomposition algorithm to assign alternating colors to adjacent shapes within IC layout 1018*b*. For example, a color pattern from shape 1022*a* (which is pre-colored to color2) to shape 1020*a* (which is pre-colored to color1) would be color2, color1, color2, color1.

Figure 10E:
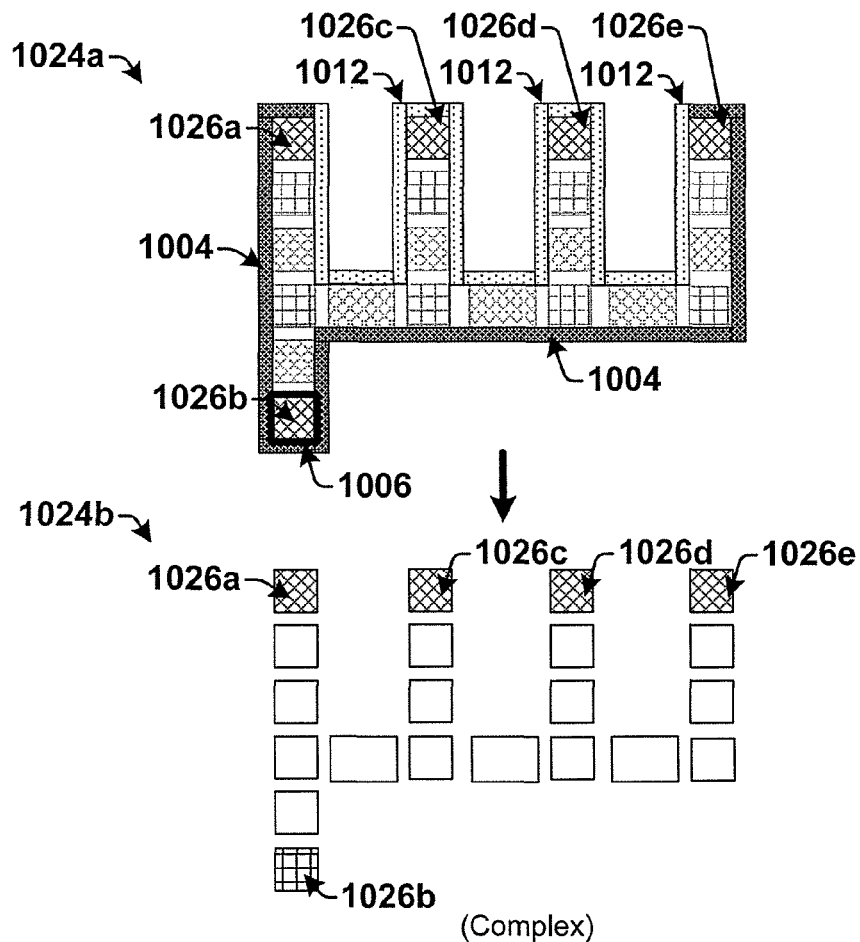

In a first IC layout 1024*a* shown in FIG. 10E, a structure comprises pre-colored shapes 1026*a*-1026*e* having a first color. Good paths 1012 extend between shapes 1026*a* and 1026*c*, 1026*c* and 1026*d*, and 1026*d* and 1026*e*, since alternating colors can be assigned to shapes along these paths without adjacent shapes in the path having a same color. Bad paths 1004 extend between pre-colored shapes 1026*a* and 1026*b* and 1026*b* and 1026*e*, since alternating colors cannot be assigned to shapes along a path extending between 1010*a* and 1010*b* without adjacent shapes in the path having a same color. Therefore, IC layout 1024*a* comprises a complex route having BGGGB.

Since layout 1024*a* comprises a complex route it is solved by a succession of hints. First, a hint is provided to ignore continuous GGG cases. This simplifies the complex route to a BGB case. To solve the BGB case, a pre-coloring hint marker 1006 is provided adjust the color of pre-colored shapes at the ends of the BGB, by highlighting pre-colored shapes 1026*b*, indicating that an adjustment of the color of pre-coloring from the pre-colored shapes 1026*b* will resolve the violation paths. In a second IC layout 1024*b* shown in FIG. 10E, the structure has been modified in response to the hint marker 1006 to change in the color of the pre-colored shapes 1026*b*. Such a change in color causes the second IC layout 1024*b* to be free of coloring violations. This is because adjusting the coloring of pre-colored shape 1026*a* allows for a decomposition algorithm to assign alternating colors to adjacent shapes within IC layout 1024*b*. For example, a color pattern from shape 1026*a* (which is pre-colored to color1) to shape 1026*ba* (which is pre-colored to color2) would be color1, color2, color1, color2, color1, color2.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method and apparatus for identifying pre-coloring violations and for providing hints and/or warnings to a designer to eliminate the pre-coloring violations.

In some embodiments, the present disclosure relates to a method for developing a violation free IC layout. The method comprises identifying a violation path that has two adjacent shapes that cannot be decomposed in a manner that does not violate a minimum spacing rule, which extends between two or more pre-colored shapes within a double patterning technology (DPT) layer of a pre-colored IC layout having two or more pre-colored shapes. The method further comprises identifying good paths and bad paths between the two or more pre-colored shapes, wherein upon being decomposed the good paths will have no adjacent shapes with a same color and the bad paths will have adjacent shapes with a same color. The method further comprises providing hints or warnings based upon the good paths and the bad paths, wherein the hints or warnings provide guidance to eliminate the violation path.

In another embodiment, the present disclosure relates to a method for developing a violation free IC layout, comprising identifying one or more violation paths that have two adjacent shapes that cannot be decomposed in a manner that does not violate a minimum spacing rule, which extend between two or more pre-colored shapes within a double patterning technology (DPT) layer of a pre-colored IC layout having two or more pre-colored shapes. The method further comprises identifying good paths and bad paths between the two or more pre-colored shapes, wherein upon being decomposed the good paths will have no adjacent shapes with a same color and the bad paths will have adjacent shapes with a same color. The method further comprises determining a combination of the good paths and the bad paths. The method further comprises generating hints or warnings based upon the combination to eliminate the violation paths within the DPT layer caused by the pre-colored shapes, wherein the hints and warnings comprise a G0-space hints to increase a size of a space within the DPT layer or pre-coloring hints to adjust a color of a pre-colored shape within the DPT layer.

In another embodiment, the present disclosure relates to a system. The system comprises a memory element configured to store a pre-colored IC layout comprising a DPT-layer having a plurality of shapes to be formed in the DPT-layer by a multi-patterning process and a design rule checking configured to identify one or more violation paths within the DPT layer of the pre-colored IC layout. A processor is coupled to the memory element. The processor is configured to perform the steps of identifying a violation path that has two adjacent shapes that cannot be decomposed in a manner that does not violate a minimum spacing rule, which extend between the two or more pre-colored shapes within a double patterning technology (DPT) layer of a pre-colored IC layout having two or more pre-colored shapes, identifying good paths and bad paths between the two or more pre-colored shapes, wherein upon being decomposed the good paths will have no adjacent shapes with a same color and the bad paths will have adjacent shapes with a same color, and providing a hint or warning based upon the good paths and the bad paths, wherein the hint or warning provides guidance to eliminate the violation path.

What is claimed is:

1. A method for developing a violation free IC layout, comprising:
    identifying a violation path that has two adjacent shapes that cannot be decomposed in a manner that does not violate a minimum spacing rule by using a computer, wherein the violation path extends between two or more pre-colored shapes within a double patterning technology (DPT) layer of a pre-colored IC layout having two or more pre-colored shapes, and wherein upon being decomposed pre-colored shapes of the DPT layer having a first color are assigned to a first photomask and pre-colored shapes of the DPT layer having a second color are assigned to a second, different photomask;
    identifying good paths and bad paths between the two or more pre-colored shapes by using the computer, wherein upon being decomposed the good paths will have no adjacent shapes with a same color and the bad paths will have adjacent shapes with a same color; and
    providing hints or warnings based upon the good paths and the bad paths, wherein the hints or warnings provide guidance to eliminate the violation path.

2. The method of claim 1, further comprising:
    determining a combination of the good paths and the bad paths; and
    generating the hints or warnings based upon the combination.

3. The method of claim 1, wherein providing the hints and warnings comprises providing a G0-space hint to increase a size of a space along a violation path within the DPT layer.

4. The method of claim 3,
    wherein providing a G0-space hint comprises identifying a space within the DPT layer, which upon being enlarged above a G0-space will reduce a number of violation paths within the DPT layer; and
    wherein providing a G0-space warning comprises identifying a space within the DPT layer, which upon being enlarged above the G0-space will not reduce a number of violation paths within the DPT layer.

5. The method of claim 4, wherein:
    the G0-space hint identifies a space disposed between a bad path and a bad path; and
    the G0-space warning identifies a space disposed between a good path and a bad path.

6. The method of claim 1, wherein providing the hints and warnings comprises providing a pre-coloring hint to adjust a color of a pre-colored shape within the DPT layer.

7. The method of claim 6,
    wherein providing a pre-coloring hint comprises identifying a pre-colored shape within the DPT layer, such that adjusting a color of the identified pre-colored shape will reduce a number of violation paths within the DPT layer; and
    wherein providing a pre-coloring warning comprises identifying a pre-colored shape within the DPT layer, such that adjusting a color of the identified pre-colored shape will not reduce a number of violation paths within the DPT layer.

8. The method of claim 6, further comprising:
    identifying a first route having a bad path that is not adjacent to a good path, and providing a first pre-coloring hint to adjust a color of one or more interval pre-colored shapes from the first route;
    identifying a second route having a bad path that is located at an end of the second route and adjacent to a good path, and providing a second pre-coloring hint to adjust a color of a second pre-colored shape that is located at the end of the second route; or
    identifying a third route having a good path that is disposed between bad paths along the third route, and providing a third pre-coloring hint to adjust a color of pre-colored shapes between the good paths and the bad path.

9. The method of claim 8, wherein analyzing violations further comprises:
identifying a complex route having a combination of violation paths that cannot be resolved by one of the first, second, and third pre-coloring hints, and acting upon the complex route with a succession pre-coloring hints to reduce a complexity of the complex route.

10. The method of claim 9, further comprising:
providing a pre-coloring warning to pre-colored shapes that cannot be adjusted based upon pre-coloring hints to reduce a number of violation paths with the DPT layer.

11. A method for developing a violation free IC layout, comprising:
identifying one or more violation paths that have two adjacent shapes that cannot be decomposed in a manner that does not violate a minimum spacing rule by using a computer, wherein the one or more violation paths extend between two or more pre-colored shapes within a double patterning technology (DPT) layer of a pre-colored IC layout having two or more pre-colored shapes, and wherein upon being decomposed pre-colored shapes of the DPT layer having a first color are assigned to a first photomask and pre-colored shapes of the DPT layer having a second color are assigned to a second, different photomask;
identifying good paths and bad paths between the two or more pre-colored shapes by using the computer, wherein upon being decomposed the good paths will have no adjacent shapes with a same color and the bad paths will have adjacent shapes with a same color;
determining a combination of the good paths and the bad paths; and
generating hints or warnings based upon the combination to eliminate the violation paths within the DPT layer caused by the pre-colored shapes, wherein the hints and warnings comprise a G0-space hints to increase a size of a space within the DPT layer or pre-coloring hints to adjust a color of a pre-colored shape within the DPT layer.

12. The method of claim 11, further comprising:
providing a G0-space hint by identifying a space disposed between a bad path and a bad path, which upon being enlarged above the G0-space will reduce a number of violation paths within the DPT layer; and
providing a G0-space warning by identifying a space disposed between a good path and a bad path, which upon being enlarged above the G0-space will not reduce a number of violation paths within the DPT layer.

13. The method of claim 11,
wherein providing a pre-coloring hint comprises identifying a pre-colored shape within the DPT layer, such that adjusting a color of the identified pre-colored shape will reduce a number of violation paths within the DPT layer; and
wherein providing a pre-coloring warning comprises identifying a pre-colored shape within the DPT layer, such that adjusting a color of the identified pre-colored shape will not reduce a number of violation paths within the DPT layer.

14. The method of claim 11, further comprising:
identifying a first route having a bad path that is not adjacent to a good path, and providing a first pre-coloring hint to adjust a color of one or more interval pre-colored shapes from the first route;
identifying a second route having a bad path that is located at an end of the second route and adjacent to a good path, and providing a pre-coloring hint to adjust a color of a second pre-colored shape that is located at the end of the second route; or
identifying a third route having a good path that is disposed between bad paths along the third route, and providing a third pre-coloring hint to adjust a color of pre-colored shapes between the good paths and the bad path.

15. A system, comprising:
a memory element configured to store a pre-colored IC layout comprising a DPT-layer having a plurality of shapes to be formed in the DPT-layer by a multi-patterning process and a design rule checking configured to identify one or more violation paths within the DPT layer of the pre-colored IC layout;
a processor coupled to the memory element and configured for performing the steps of:
identifying a violation path that has two adjacent shapes that cannot be decomposed in a manner that does not violate a minimum spacing rule, which extend between the two or more pre-colored shapes within a double patterning technology (DPT) layer of a pre-colored IC layout having two or more pre-colored shapes, wherein upon being decomposed pre-colored shapes of the DPT layer having a first color are assigned to a first photomask and pre-colored shapes of the DPT layer having a second color are assigned to a different, second photomask;
identifying good paths and bad paths between the two or more pre-colored shapes, wherein upon being decomposed the good paths will have no adjacent shapes with a same color and the bad paths will have adjacent shapes with a same color; and
providing a hint or warning based upon the good paths and the bad paths, wherein the hint or warning provides guidance to eliminate the violation path.

16. The system of claim 15, wherein the processor comprises:
a pre-coloring fixing utility configured to determine a combination of the good paths and the bad paths and to generate the hint or warning based upon the combination.

17. The system of claim 16, wherein the hint or warning comprises a G0-space hint to increase a size of a space along a violation path within the DPT layer.

18. The system of claim 17, wherein the pre-coloring fixing utility is configured to:
provide a G0-space hint by identifying a space within the DPT layer, which upon being enlarged above a G0-space will reduce a number of violation paths within the DPT layer; and
provide a G0-space warning by identifying a space within the DPT layer, which upon being enlarged above the G0-space will not reduce a number of violation paths within the DPT layer.

19. The system of claim 16, wherein the hint or warning comprises a pre-coloring hint to adjust a color of a pre-colored shape within the DPT layer.

20. The system of claim 19, wherein the pre-coloring fixing utility is configured to:
identifying a first route having a bad path that is not adjacent to a good path, and providing a first pre-coloring hint to adjust a color of one or more interval pre-colored shapes from the first route;
identifying a second route having a bad path that is located at an end of the second route and adjacent to a good path, and providing a pre-coloring hint to adjust a color of a second pre-colored shape that is located at the end of the second route; or identifying a third route having a good path that is disposed between bad paths along the third route, and providing a third pre-coloring hint to adjust a color of pre-colored shapes between the good paths and the bad path.

* * * * *